United States Patent
Dong

(10) Patent No.: US 12,009,129 B2
(45) Date of Patent: Jun. 11, 2024

(54) STACKED SPIRAL INDUCTOR

(71) Applicant: CSMC TECHNOLOGIES FAB2 CO., LTD., Jiangsu (CN)

(72) Inventor: Congying Dong, Jiangsu (CN)

(73) Assignee: CSMC TECHNOLOGIES FAB2 CO., LTD. (CN)

( * ) Notice: Subject to any disclaimer, the term of this patent is extended or adjusted under 35 U.S.C. 154(b) by 0 days.

(21) Appl. No.: 18/308,399

(22) Filed: Apr. 27, 2023

(65) Prior Publication Data

US 2023/0268111 A1  Aug. 24, 2023

Related U.S. Application Data

(62) Division of application No. 16/481,600, filed as application No. PCT/CN2018/094241 on Jul. 3, 2018, now abandoned.

(30) Foreign Application Priority Data

Jul. 3, 2017 (CN) .......................... 201710534700.2

(51) Int. Cl.
*H01F 17/00* (2006.01)
*H01L 23/522* (2006.01)

(52) U.S. Cl.
CPC ..... *H01F 17/0013* (2013.01); *H01L 23/5227* (2013.01); *H01F 2017/0086* (2013.01)

(58) Field of Classification Search
CPC ......... H01F 17/0013; H01F 2017/0086; H01F 2017/0073; H01F 2017/008
USPC ........................................................ 336/200
See application file for complete search history.

(56) References Cited

U.S. PATENT DOCUMENTS

| | | | |
|---|---|---|---|
| 7,825,764 B2 | 11/2010 | Feldtkeller | |
| 8,344,841 B2 | 1/2013 | Gertenbach et al. | |
| 8,358,192 B2* | 1/2013 | Kireev | H01F 17/0013 336/200 |
| 8,941,212 B2 | 1/2015 | Yen et al. | |
| 10,217,703 B2* | 2/2019 | Upadhyaya | H03B 5/1215 |

(Continued)

FOREIGN PATENT DOCUMENTS

| | | |
|---|---|---|
| CN | 1578129 A | 2/2005 |
| CN | 101017816 A | 8/2007 |

(Continued)

OTHER PUBLICATIONS

Office Action dated Nov. 5, 2019 issued in corresponding Chinese Patent Application No. 201710534700.2 (6 pages).

(Continued)

*Primary Examiner* — Shawki S Ismail
*Assistant Examiner* — Joselito S. Baisa
(74) *Attorney, Agent, or Firm* — Polsinelli PC

(57) ABSTRACT

A stacked spiral inductor, comprising: a substrate, and multiple stacked insulating layers and inductive metal layers formed on the substrate by means of a semiconductor process. Each inductive metal layer comprises a conductive coil in a shape of a spiral and a through hole area used for connecting two adjacent inductive metal layers. The conductive coils of the inductive metal layers have a common coil center. In two adjacent inductive metal layers, the conductive coil of the lower inductive metal layer is retracted toward the coil center with respect to the conductive coil of the upper inductive metal layer.

8 Claims, 4 Drawing Sheets

(56) References Cited

U.S. PATENT DOCUMENTS

| | | |
|---|---|---|
| 2005/0012567 A1 | 1/2005 | Liu |
| 2006/0284718 A1 | 12/2006 | Baumgartner et al. |
| 2008/0012678 A1 | 1/2008 | Lee |
| 2008/0079527 A1 | 4/2008 | Lee |
| 2012/0241904 A1* | 9/2012 | Wu ..................... H01L 27/08 257/E27.07 |
| 2012/0242446 A1* | 9/2012 | Wu ................... H01L 23/5227 336/192 |
| 2014/0117494 A1* | 5/2014 | Jing ..................... H01L 28/10 257/E27.011 |
| 2014/0117496 A1* | 5/2014 | Cheng ................ H01L 23/552 438/381 |
| 2014/0361417 A1* | 12/2014 | Liu .................... H01L 23/5225 438/758 |
| 2016/0035671 A1* | 2/2016 | Huang ............... H01F 17/0006 336/200 |
| 2016/0329281 A1 | 11/2016 | Yen et al. |

FOREIGN PATENT DOCUMENTS

| | | | |
|---|---|---|---|
| CN | 101447275 A | 6/2009 | |
| CN | 101617374 A | 12/2009 | |
| CN | 101783331 A | 7/2010 | |
| CN | 102169868 A | 8/2011 | |
| CN | 103518260 A * | 1/2014 | ......... H01L 23/5225 |
| CN | 104733426 A | 6/2015 | |
| CN | 104952853 A * | 9/2015 | |
| CN | 105280605 A | 1/2016 | |

OTHER PUBLICATIONS

International Search Report dated Aug. 29, 2018 in PCT/CN2018/094241 (2 pages).

* cited by examiner

STACKED SPIRAL INDUCTOR

CROSS REFERENCE TO RELATED APPLICATIONS

This application is a divisional application for U.S. application Ser. No. 16/481,600, filed on Jul. 29, 2019, which is a National Stage for International Application PCT/CN2018/094241, filed on Jul. 3, 2018, which claims priority of Chinese Patent Application No. 201710534700.2, filed with the CNIPA on Jul. 3, 2017, and entitled "STACKED SPIRAL INDUCTOR", each of which is incorporated herein by reference in its entirety for all purposes.

TECHNICAL FIELD

The present disclosure relates to semiconductor technology, and more particularly, to a stacked spiral inductor.

BACKGROUND

A conventional stacked spiral inductor is a stacked spiral inductor having three metal layers connected to each other, which is obtained by forming a planar spiral inductor on each metal layer and connecting the spiral inductors of two adjacent layers through a metal through hole. The shape and the size of the planar spiral inductor in a first metal layer, a second metal layer, and a third metal layer are the same. According to the conventional stacked spiral inductor, a parasitic capacitance of the planar spiral inductors between the metal layers is too large, and a parasitic coupling capacitance between the metal layer and a silicon substrate becomes larger as well, which seriously affects the performance of the stacked spiral inductor.

SUMMARY

Accordingly, it is necessary to provide a stacked spiral inductor capable of improving the performance of the spiral inductor on the same substrate area without changing the existing process technology.

Provided is a stacked spiral inductor, including: a substrate, and multiple stacked insulating layers and inductive metal layers formed on the substrate via a semiconductor process. The inductive metal layer includes a conductive coil in a shape of a spiral and a through hole area used to connect two adjacent inductive metal layers. The conductive coils of the inductive metal layers have a common coil center. In two adjacent inductive metal layers, the conductive coil of a lower inductive metal layer is retracted toward the coil center with respect to the conductive coil of an upper inductive metal layer.

Details of one or more embodiments of the disclosure are described in the accompanying drawings and description below. Other features, objectives, and advantages of the disclosure will become apparent from the description, drawings and claims.

BRIEF DESCRIPTION OF THE DRAWINGS

In order to better describe and illustrate the embodiments and/or examples of the disclosure disclosed herein, one or more drawings may be referred. Additional details or examples for describing the drawings should not be considered as limiting the scope of any of the disclosure, the presently described embodiments and/or examples, and the best mode of the disclosure currently understood.

DETAILED DESCRIPTION OF THE EMBODIMENTS

To facilitate understanding the present disclosure, the present disclosure will be described more thoroughly hereinafter in reference with the relative accompanying drawings. The preferred embodiments of the present disclosure are provided in the accompanying drawings. However, the present disclosure may be implemented in various forms, and should not be construed as limited to the embodiments set forth herein. Rather, the objective of providing these embodiments is to understand the disclosed description of the present disclosure more thoroughly.

Unless otherwise defined, all technical and scientific terms as used herein have the same meaning as commonly understood by those skilled in the art. The terms used herein in the description of the present disclosure are for the purpose of describing particular embodiments only, and are not intended to be limiting of the present disclosure. The term "and/or" used herein includes arbitrary and all combinations of one or more of the associated listed items.

A stacked spiral inductor includes a substrate, and multiple stacked insulating layers and inductive metal layers formed on the substrate by a semiconductor process.

The substrate may be a silicon substrate, or may also be a gallium arsenide substrate, a silicon germanium substrate, or other semiconductor substrates. The insulating layer may be formed on the substrate by deposition or epitaxy. The insulating layer may be a silicon dioxide layer, or a silicon nitride layer, or other insulating oxide layers. A through hole is formed by etching the insulating layer. The inductive metal layer is formed by sputtering on the insulating layer. The multiple stacked insulating layers and inductive metal layers are formed on the substrate by repeating the aforedescribed semiconductor process.

Figure 2:
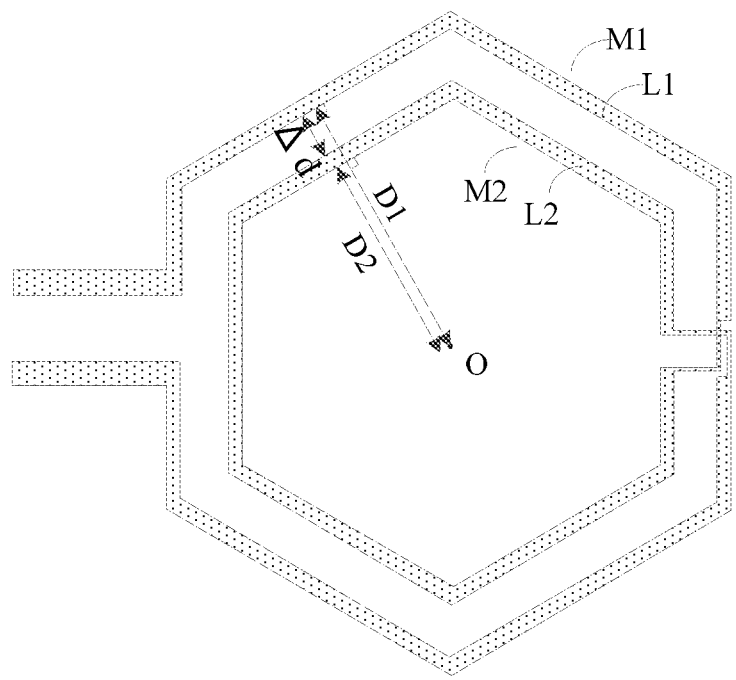
FIG. 2 is a top view of a stacked spiral inductor according to an embodiment.

In an embodiment, a conductive coil in a shape of a spiral and a through hole area used to connect two adjacent inductive metal layers is formed on one of the inductive metal layers by selectively etching. The through hole area of the inductive metal layer is arranged corresponding to the through hole of the insulating layer. As shown in FIG. 2, a top view of a stacked spiral inductor is shown. The conductive coils on the inductive metal layers formed by etching are similar in shape with a common coil center O, but are different in size. In two adjacent inductive metal layers, a conductive coil L2 of a lower inductive metal layer is retracted towards the coil center O with respect to a conductive coil L1 of an upper inductive metal layer, that is, a distance between the conductive coil L2 of the lower inductive metal layer and the coil center O is smaller than a distance between the conductive coil L1 of the upper inductive metal layer and the coil center O.

Figure 1:
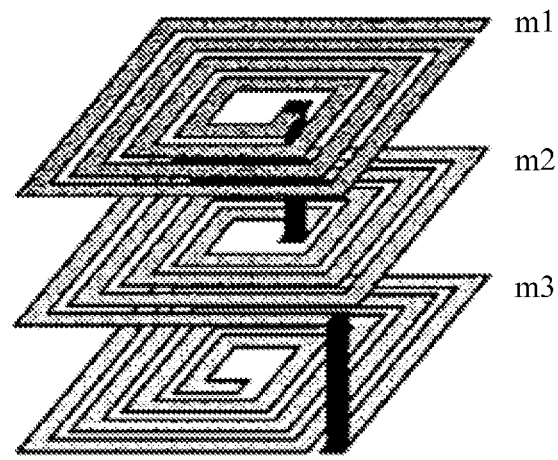
FIG. 1 is a schematic view of a conventional stacked spiral inductor.

In the case of the same area, as shown in FIG. 1, a conventional stacked on-chip spiral inductor is directly translated to a lower layer, that is, the planar spiral inductors on the first metal layer m1, the second metal layer m2, and the third inductive metal layer m3 are all the same in shape and size. When operating at a high frequency, a parasitic capacitance like a flat plate capacitor is generated between two adjacent inductive metal layers, which seriously affects the performance of the on-chip spiral inductor. However, according to the embodiment of the present disclosure, the conductive coil on the lower inductive metal layer of two adjacent inductive metal layers is retracted toward the center with respect to the conductive coil on the upper inductive metal layer of the two adjacent inductive metal layers, which may reduce the parasitic capacitance between the two adjacent inductive metal layers and improve their own resonant frequencies under an circumstance in which the conditions of existing process technology are not required to be changed and the substrate areas are the same, which may further increase a quality factor Q of the spiral inductor and improve the performance of the spiral inductor.

In an embodiment, referring to FIG. 2, the stacked spiral inductor includes two inductive metal layers, which are respectively a top inductive metal layer M1 (i.e. a first inductive metal layer M1) and a secondary top inductive metal layer (i.e. a second inductive metal layer M2). A distance of the conductive coil L2 of the second inductive metal layer M2 retracted towards the center O of the conductive coils with respect to the conductive coil L1 of the first inductive metal layer M1, ranges from 2 μm to 3 μm. That is, a distance D2 of the conductive coil L2 of the second inductive metal layer M2 away from the coil center O is smaller than a distance D1 of the conductive coil L1 of the first inductive metal layer M1 away from the coil center O. A distance range (δd=D1−D2) of the conductive coil L2 of the second inductive metal layer M2 retracted towards the center O with respect to the conductive coil L1 of the first inductive metal layer M1 is from 2 μm to 3 μm.

In an embodiment, the stacked spiral inductor includes n (n>2) inductive metal layers. A first inductive metal layer, a second inductive metal layer, . . . , and an n-th inductive metal layer are sequentially included from a top inductive metal layer to a bottom inductive metal layer. Along a direction from the top inductive metal layer to the bottom inductive metal layer the distances between the conductive coils of the inductive metal layers and the center are sequentially D1, D2, . . . , Dn. The retracted distance of the conductive coil of the second inductive metal layer with respect to the conductive coil of the first inductive metal layer is Δd1=D1−D2. The retracted distance of the conductive coil of the third inductive metal layer with respect to the conductive coil of the second inductive metal layer is Δd2=D2−D3. The retracted distance of the conductive coil of the (n−1)-th inductive metal layer with respect to the conductive coil of the n-th inductive metal layer is $\Delta d_{n-1}=D_{n-1}-D_n$.

In an embodiment, the distances of Δd1, Δd2, . . . , $\Delta d_{n-1}$ for each retraction are equal to each other, which may be equal to any value varying between 2 μm an 3 μm.

In an embodiment, the distances of Δd1, Δd2, . . . , $\Delta d_{n-1}$ for each retraction form an arithmetic progression. The arithmetic progression may be with Δd1<Δd2< . . . <$\Delta d_{n-1}$, or may be with Δd1>Δd2> . . . >$\Delta d_{n-1}$. In practical applications, the distance for each retraction may be set depending on actual needs, and the distance for each retraction is not limited to the retraction range described in the above embodiment.

In an embodiment, the conductive coil of the same inductive metal layer has the same line width, and the line width of the conductive coil ranges from 6 μm to 15 μm.

Specifically, the conductive coils of the inductive metal layers from the top inductive metal layer to the bottom inductive metal layer may have the same line width, or have line widths changing in a gradually increasing trend or in a gradually decreasing trend, or changing alternatively. The line width of the conductive coil of each inductive metal layer may be set depending on the actual needs.

Figure 3:
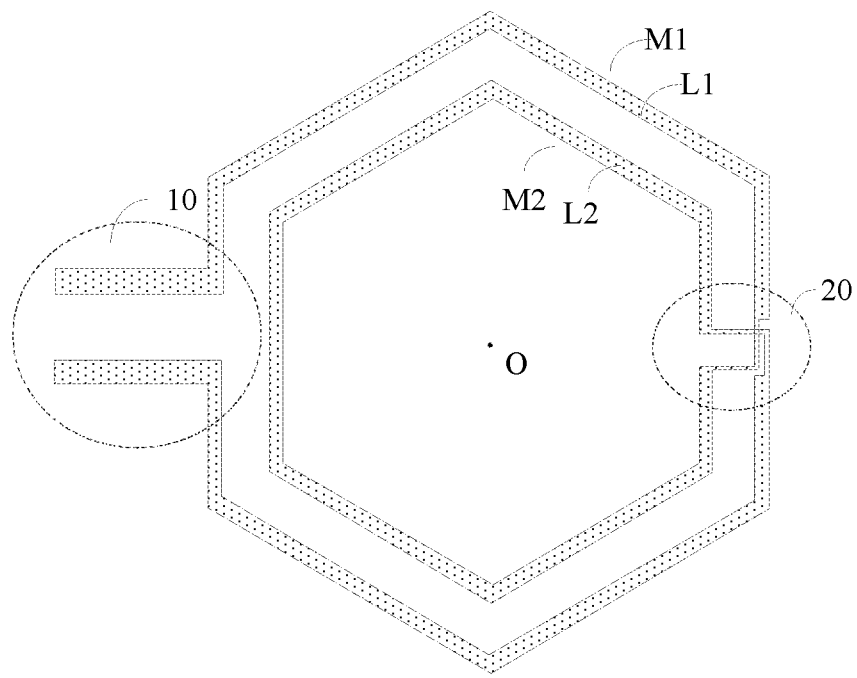
FIG. 3 is another top view of a stacked spiral inductor according to an embodiment.

In an embodiment, the conductive coil of each inductive metal layer includes a lead end, and an opening end opposite to the lead end. Referring to FIG. 3, the inductive metal layers include the inductive metal layer M1 (the first inductive metal layer) at the top thereof, and the secondary top inductive metal layer M2 (the second inductive metal layer). The conductive coil L1 of the first inductive metal layer M1 includes the lead end 10, and the opening end 20 opposite to the lead end 10. The lead end 10 is a lead terminal of the spiral inductor. The opening end 20 is provided with the through hole area (not shown).

Figure 4:
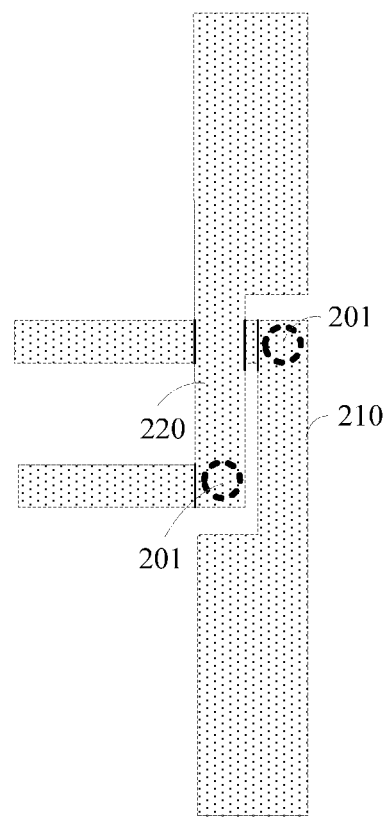
FIG. 4 is a partially enlarged view of an opening end in a stacked spiral inductor according to an embodiment.

Specifically, referring to FIG. 4, the opening end 20 includes a first extending portion 210 and a second extending portion 220, which are arranged oppositely and spaced from each other. The through hole area 201 are arranged respectively at the ends of the first extending portion 210 and the second extending portion 220. A sum of line widths of the first extending portion 210 and the second extending portion 220 is less than the line width of the conductive coil L1 (not shown). In an embodiment, the line width of the first extending portion 210 is equal to the line width of the second extending portion, and the line widths of the first extending portion 210 and the second extending portion 220 are ⅓ of the line width of the conductive coil L1.

Since the through hole area is arranged in the first extending portion and the second extending portion that are opposite to each other and spaced from each other, a corner point is not required to be arranged in the through hole area, which simplifies complexity of the process of etching the conductive coil, improves efficiency, and reduces costs. The conductive coil of the first inductive metal layer may be electrically connected to the conductive coil of the second inductive metal layer via the through hole area.

Figure 5:
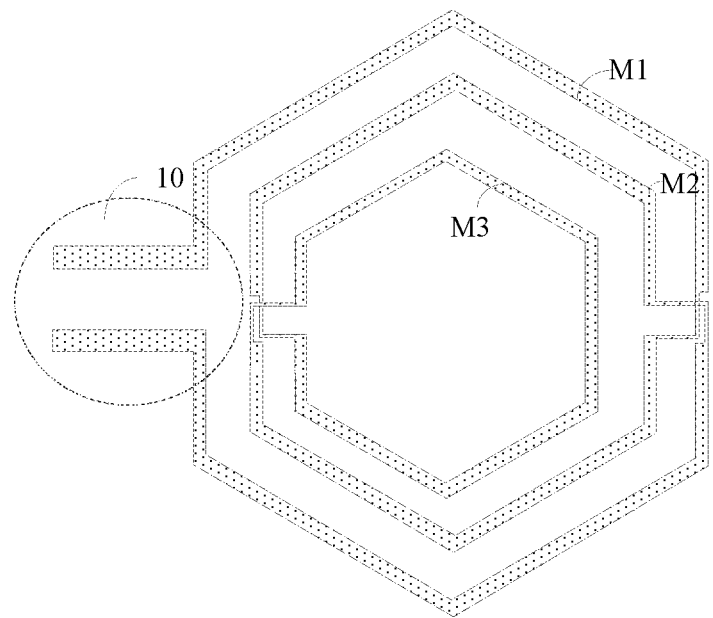
FIG. 5 is a top view of a stacked spiral inductor according to another embodiment.

In an embodiment, the stacked spiral inductor includes n (n>2) inductive metal layers. The first inductive metal layer, the second inductive metal layer, . . . , and the n-th inductive metal layer are sequentially included from the top inductive metal layer to the bottom inductive metal layer. The conductive coil of the first inductive metal layer includes the lead end, and the opening end opposite to the lead end. The lead end is the lead terminal of the spiral inductor. The opening end is provided with the through hole area. Referring to FIG. 5, the through hole area (not shown) in the second inductive metal layer M2, which is used to connect with an adjacent third inductive metal layer M3 at a lower side, is arranged at the same side as the lead end 10 of the first inductive metal layer M1. The through hole area in the third inductive metal layer M3, which is used to connect with an adjacent fourth metal layer at a lower side, is arranged at the same side as the lead end of the second inductive metal layer. Accordingly, if n is an odd number, the through hole area in the n−1-th inductive metal layer, which is used to connect with an adjacent n-th metal layer at a lower side, is arranged at the same side as the lead end of the first inductive metal layer. If n is an even number, the through hole area in the n−1-th inductive metal layer, which is used to connect with the adjacent n-th metal layer at a lower side, is arranged at the same side as the lead end of the second inductive metal layer.

In the above embodiment, the hexagonal spiral inductor is merely for description. However, in practical applications, the shape of the spiral inductor is not limited thereto, and can be other types of spirals. For example, a quadrangle, an octagon, or a circle may be applied to the present disclosure.

In an embodiment, the stacked spiral inductor further includes a patterned ground shield (PGS) arranged between the substrate and the bottommost inductive metal layer. The patterned ground shield is used to cut off a magnetic field from the inductor to the silicon substrate, reducing an electromagnetic consumption caused by the substrate, thereby increasing the Q value.

Figure 6:
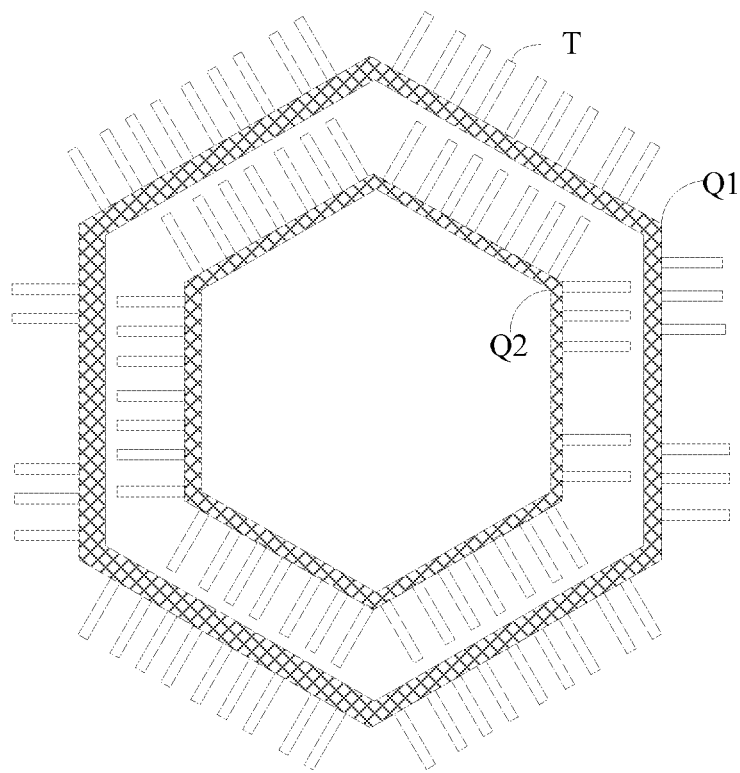
FIG. 6 is a top view of a patterned ground shield in a stacked spiral inductor according to an embodiment.

Referring to FIG. 6, the patterned ground shield (not shown) is provided with a plurality of concentric metal rings (Q1, Q2). The (Q1, Q2) are both provided with a plurality of metal strips T perpendicular to the metal rings. A length of the metal strip T is less than a distance between two adjacent metal rings. The plurality of metal strips are not connected to each other inside the plane but maintain fixed distances. The plurality of metal strips are merely connected to each other at the outermost edge of the plane through the metal ring and are grounded, thereby reducing the electromagnetic consumption on the silicon substrate.

In an embodiment, a number of the metal rings is equal to a number of the inductive metal layers, and the shape of the metal ring is similar to the shape of the conductive coil.

Figure 7:
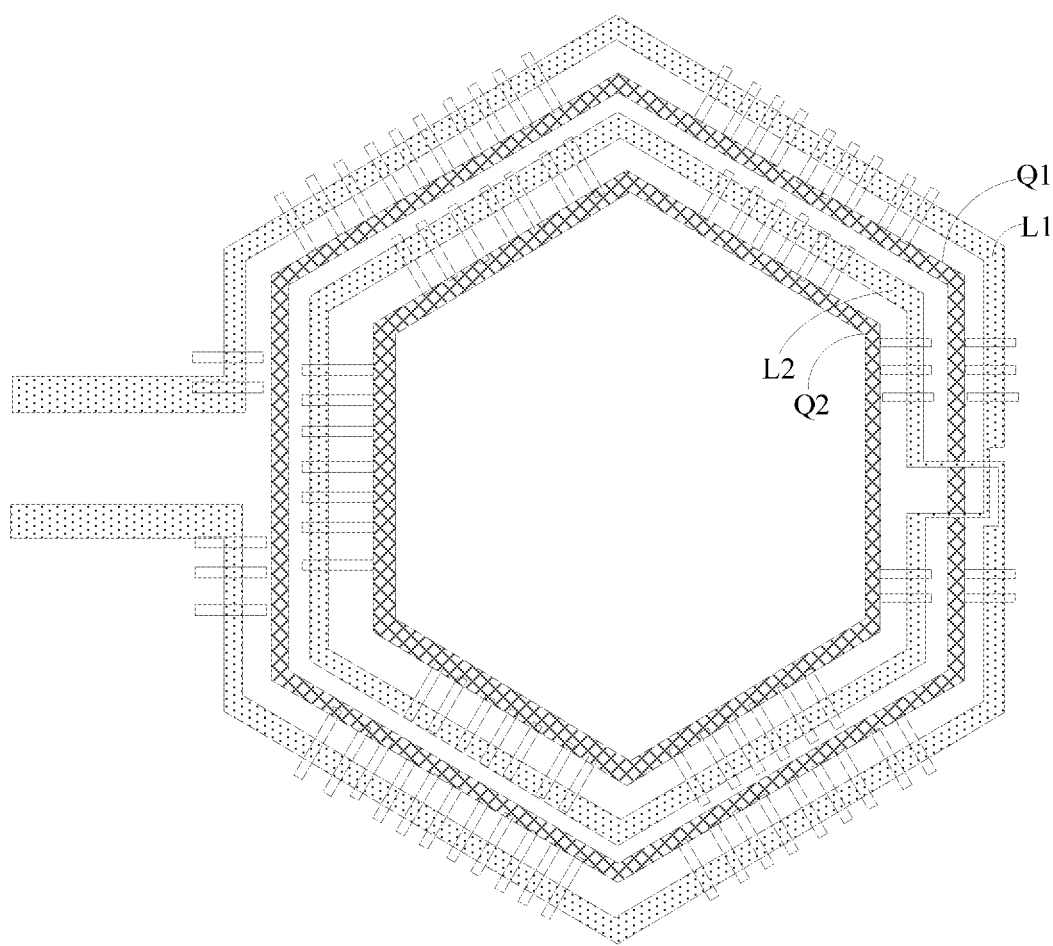
FIG. 7 is a top view of a stacked spiral inductor according to another embodiment.

Specifically, referring to FIG. 7, if the number of the inductive conductive metal layers is two, the patterned ground shield is provided with two concentric metal rings. Spatially, the metal strips on the outermost metal ring Q1 are perpendicular to the conductive coil L1 of the first inductive metal layer correspondingly. The metal strips on the innermost metal ring Q2 are perpendicular to the conductive coil L2 of the second inductive metal layer correspondingly. That is, if the conductive coil L2 of the second inductor metal layer and the conductive coil L1 of the first inductor metal layer are projected to the patterned ground shield, the innermost metal ring Q2, the conductive coil L2 of the second inductive metal layer, the outermost metal ring Q1, and the conductive coil L1 of the first inductive metal layer are concentrically arranged sequentially from an inside to an outside thereof.

Specifically, if the number of the inductive conductive metal layers is n (n>2), the patterned ground shield is then provided with n concentric metal rings. Spatially, the metal strips corresponding to the metal rings from the outermost to the innermost are sequentially perpendicular to the corresponding conductive coils of the inductive metal layers from the top inductive metal layer to the bottom inductive metal layer respectively. The metal strips on the outermost metal ring are perpendicular to the conductive coil of the top inductive metal layer correspondingly. Accordingly, the metal strips on the innermost metal ring are perpendicular to the conductive coil of the bottom inductive metal layer correspondingly. It can also be understood that, if the conductive coils of the inductive metal layers from the top inductive metal layer to the bottom inductive metal layer are projected on the patterned ground shield, the conductive coils in the inductive metal layers from the top inductive metal layer to the bottom inductive metal layer are arranged sequentially at the outer side of the concentric metal rings on the patterned ground shield from the outside to the inside thereof respectively. The conductive coil of the top inductive metal layer is arranged at the outer side of the outermost metal ring of the patterned ground shield, and the conductive coil on the bottom inductive metal layer is arranged between the innermost metal ring and the secondary innermost metal ring of the patterned ground shield.

The patterned ground shield is provided with the plurality of concentric metal rings, and each metal ring is provided with the plurality of metal strips perpendicular to the metal ring. The metal strips are perpendicular to the conductive coil of each inductive metal layer. Thus, most of the eddy current effect of the silicon substrate which occurs with high-frequency electromagnetic waves can be shielded, thereby reducing the parasitic capacitance between the spiral inductor and the substrate, improving the spiral inductor quality factor Q value, and further improving the performance of the spiral inductor.

In the above embodiment, the hexagonal spiral inductor formed on the silicon substrate is merely for description. However, in practical applications, the shape of the spiral inductor is not limited thereto, and can be other types of spirals. For example, a quadrangle, an octagon or a circle may be applied to the present disclosure.

The technical features of the above embodiments can be arbitrarily combined. For the sake of brevity of description, all possible combinations of the technical features in the above embodiments are not described. However, as long as there is no collision in the combination of these technical features, it should be considered as the scope described in this specification.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A stacked spiral inductor, comprising: a substrate, and multiple stacked insulating layers and inductive metal layers formed on the substrate via a semiconductor process;
   wherein an inductive metal layer comprises a conductive coil in a shape of a spiral, and a through hole area configured to connect two adjacent inductive metal layers, and the conductive coils of the inductive metal layers have a common coil center; and
   wherein in two adjacent inductive metal layers, a conductive coil of a lower inductive metal layer is retracted towards the coil center with respect to a conductive coil of an upper inductive metal layer;
   wherein the conductive coil of each inductive metal layer comprises a lead end and an opening end opposite to the lead end;
   an inductive metal layer located on a top is a first inductive metal layer, an inductive metal layer arranged adjacent to the first inductive metal layer is a second inductive metal layer, and an inductive metal layer adjacent to and below the second inductive metal layer is a third inductive metal layer;
   a through hole area in the first inductive metal layer configured to connect with the second inductive metal layer is arranged at the opening end of the first inductive metal layer, and the lead end of the first inductive metal layer is a lead terminal of the spiral inductor; and a through hole area in the second inductive metal layer configured to connect with the third inductive metal layer is arranged at the same side as the lead end of the first inductive metal layer;

the stacked spiral inductor further comprises a patterned ground shield arranged between the substrate and a bottommost inductive metal layer;

wherein the patterned ground shield is provided with a plurality of concentric metal rings, and each metal ring is provided with a plurality of metal strips perpendicular to the metal ring, and a length of the metal strip is less than a distance between two adjacent metal rings.

2. The stacked spiral inductor of claim 1, wherein the opening end comprises a first extending portion and a second extending portion that are arranged oppositely and spaced from each other, and the through hole area is arranged at ends of the first extending portion and the second extending portion respectively.

3. The stacked spiral inductor of claim 2, wherein a sum of line widths of the first extending portion and the second extending portion is less than a line width of the conductive coil.

4. The stacked spiral inductor of claim 2, wherein a line width of the first extending portion is equal to a line width of the second extending portion, and the line width of the first extending portion and the line width of the second extending portion are ⅓ of a line width of the conductive coil.

5. The stacked spiral inductor of claim 1, wherein a fixed distance is maintained between the metal strips, and an end of each metal strip is connected to the metal ring to be grounded through the metal ring.

6. The stacked spiral inductor of claim 1, wherein a number of the metal rings is equal to a number of the inductive metal layers.

7. The stacked spiral inductor of claim 6, wherein the metal strips corresponding to the metal rings from an outermost metal ring to an innermost metal ring are sequentially correspondingly perpendicular to the conductive coils of the inductive metal layers from a top inductive metal layer to a bottom inductive metal layer respectively, wherein the metal strips of the outermost metal ring are perpendicular to the conductive coil of the top inductive metal layer correspondingly, and the metal strips of the innermost metal ring are perpendicular to the conductive coil of the bottom inductive metal layer correspondingly.

8. The stacked spiral inductor of claim 1, wherein the metal ring and the conductive coil are similar in shape.

* * * * *